United States Patent [19]
Ollendorf

[11] 4,100,561
[45] Jul. 11, 1978

[54] PROTECTIVE CIRCUIT FOR MOS DEVICES

[75] Inventor: Joel Ollendorf, West Orange, N.J.

[73] Assignee: RCA Corp., New York, N.Y.

[21] Appl. No.: 689,269

[22] Filed: May 24, 1976

[51] Int. Cl.² .................. H01L 29/90; H01L 29/78
[52] U.S. Cl. ...................... 357/13; 307/237; 307/302; 357/41; 357/42; 357/43; 357/86
[58] Field of Search ............ 357/13, 41, 42, 43, 357/86; 307/237, 318, 302

[56] References Cited

U.S. PATENT DOCUMENTS

| | | | |
|---|---|---|---|
| 3,739,238 | 6/1973 | Hara | 357/43 |
| 3,787,717 | 1/1974 | Fischer et al. | 357/23 |
| 3,806,773 | 4/1974 | Watanabe | 357/41 |
| 3,934,159 | 1/1976 | Nomiya et al. | 357/41 |

OTHER PUBLICATIONS

RCA Solid-State Power Circuits Designer's Handbook (RCA, Somerville, N.J., 1971), pp. 284–285.
RCA Solid State Devices Manual, (RCA Somerville, 1975), pp. 230–231.

*Primary Examiner*—William D. Larkins
*Attorney, Agent, or Firm*—H. Christoffersen; R. P. Williams; Sanford J. Asman

[57] ABSTRACT

The circuit protects the oxide of MOS devices from destructive breakdown by limiting the potential difference which can exist between two circuit nodes. By forming a protective circuit between each pair of nodes in the circuit, the range of voltages which can exist between any two nodes is predetermined, and the range can be fixed to prevent damage to the MOS devices. The protective circuit comprises a pair of diodes, a resistor, and a bipolar transistor.

5 Claims, 8 Drawing Figures

PROTECTIVE CIRCUIT FOR MOS DEVICES

The present invention relates to a protective circuit for metal-oxide-semiconductor (MOS) devices. MOS devices employ oxide insulating layers which are subject to destructive breakdown as a result of static electricity discharges. Various types of protective networks, generally including diodes, heretofore have been described and are well known in the art.

Figure 1:
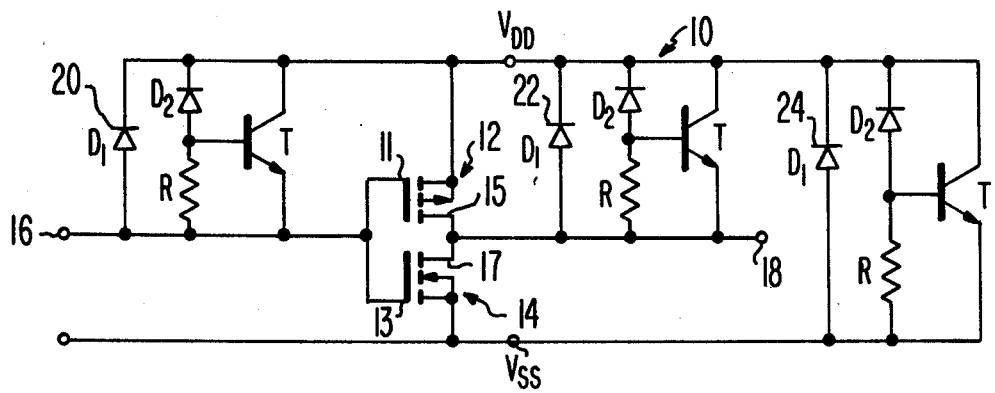
FIG. 1 is a schematic diagram of an inverter circuit which employs three of the protective circuits of the present invention.

Referring generally to FIG. 1, a complementary-symmetry MOS (COS/MOS) inverter circuit 10 employing the protective circuit of the present invention is shown. The inverter circuit 10 comprises a P-channel enhancement type insulated gate field effect transistor (IGFET) 12 and an N-channel IGFET 14 with their gates 11, 13 connected together and to the input terminal 16 of the circuit 10. The drains 15, 17 of the transistors 12, 14 are connected together and to the output terminal 18 of the circuit 10. The source and substrate of the P-channel device 12 are connected to terminals to which the positive power supply voltage, $V_{DD}$, can be applied and the source and substrate of the N-channel device 14 are connected together and to terminals to which the negative power supply voltage, $V_{SS}$, can be applied. If no negative power supply voltage is used, $V_{SS}$ may be ground potential.

The inverter circuit 10 further comprises three of the protective circuits, 20, 22, 24 of the present invention. The protective circuits 20, 22, 24 are connected between circuit nodes such as the input terminal and the terminal used for connecting the positive power supply, the output terminal and the terminal used for connecting the positive power supply, and the terminals used for connecting the negative and positive power supplies, respectively.

Each of the protective circuits 20, 22, 24 comprises a first diode $D_1$, a second diode $D_2$, a resistor R and a bipolar NPN transistor T. In the preferred embodiment of the invention, the diode $D_1$ is constructed to have a PN− junction, while the diode $D_2$ is constructed to have a PN+ junction. The cathodes of diodes $D_1$ and $D_2$ and the collector of transistor T are connected together and to the one of the protected nodes which is at the highest potential. The anode of diode $D_2$ is connected to one terminal of resistor R and to the base of transistor T. The anode of diode $D_1$, the other terminal of resistor R, and the emitter of transistor T are connected together and to the other protected node.

In the embodiment shown, there is a protective circuit formed between the positive power supply voltage terminal and each other terminal. In operation, a positive transient pulse applied to the input terminal 16 which exceeds the potential $V_{DD}$, of the positive power supply will forward bias the PN− diode $D_1$ and will clamp the input terminal 16 to a potential which is greater than $V_{DD}$ by the forward voltage drop across diode $D_1$. The forward voltage drop across $D_1$ will normally be very small compared to the voltage which will damage the MOS devices. A negative voltage transient applied to the input terminal 16 will back bias diodes $D_1$ and $D_2$. The PN+ diode $D_2$ is chosen to have a reverse breakdown voltage which will be exceeded before damage can be done to the gate oxides of the IGFETs 12, 14. The avalanche current flowing through diode $D_2$ in a reverse breakdown condition establishes a forward bias across the base-emitter junction of transistor T, causing the bipolar transistor to conduct. Thus, the negative potential at the input terminal 16 cannot be greater in magnitude than the reverse breakdown voltage of diode $D_2$ plus the forward base-emitter voltage of transistor T. The reverse breakdown voltage of diode $D_2$ is chosen to limit the negative potential on input terminal 16 to a voltage which will not damage the MOS devices 12, 14. The power dissipated in the bipolar transistor T will be greater than the power dissipated in the PN+ diode $D_2$ by a factor of the $\beta$ of the transistor T. Since a forward biased bipolar transistor can safely dissipate more power than can a diode in avalanche breakdown condition, the combination of transistor T and diode $D_2$ safely dissipates far more energy than could diode $D_2$ alone.

In a similar manner, the protective circuit 22 insures that the voltage on the output terminal 18 cannot be more positive with respect to $V_{DD}$ than a forward biased diode drop nor more negative than the reverse breakdown voltage of diode $D_2$ plus the forward base-emitter voltage of transistor T.

Finally, the protective circuit 24 insures that the negative power supply is fixed to a value between $V_{DD}$ plus a forward biased diode drop of diode $D_1$ and a value of $V_{DD}$ less the reverse breakdown voltage of diode $D_2$ plus the base-emitter voltage of transistor T. Thus, the protective circuit 24 protects the COS/MOS integrated circuit 10 from transients creating potential differences between the power supply output terminals which exceed the design limits of the COS/MOS integrated circuit.

Figure 2:
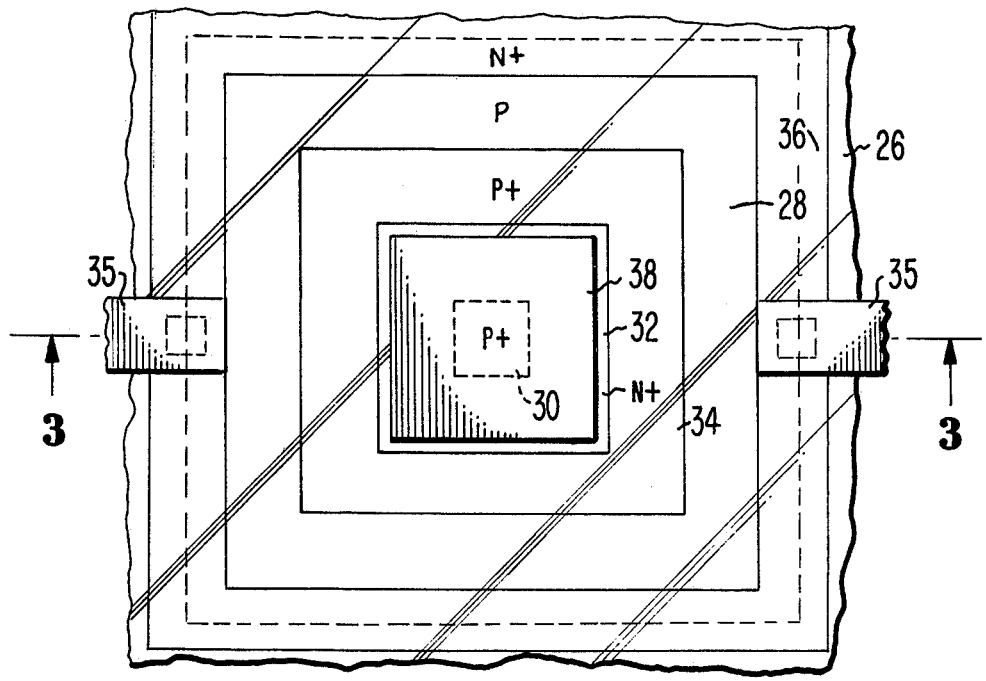
FIG. 2 is a top view of one embodiment of the protective circuit of the present invention.
Figure 3:
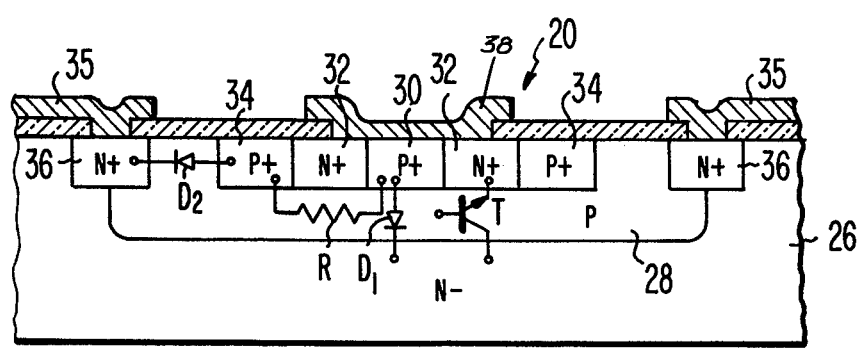
FIG. 3 is a cross-sectional view of the embodiment of FIG. 2 taken along the line 3—3 of FIG. 2.

Referring now to FIGS. 2 and 3, the top and cross sectional views of the preferred embodiment of one of the protective circuits, for example the circuit 20, of the present invention are shown. In particular, the present invention is preferably formed in the N-type substrate 26 of an MOS device. The circuit 20 includes a P well 28 having diffused therein a central P+ area 30 surrounded by an N+ area 32. These regions 30, 32 are preferably surrounded by a second P+ area 34 which acts as a channel stopper. The region 34 is desirable, but it is not required for the invention. Another N+ region 36 surrounds the P well 28. In the preferred embodiment of the invention the P well 28 is completely surrounded by N+ region 36.

The emitter of bipolar transistor T is comprised of the central N+ region 32, its base is comprised of the P well material 28, and its collector is comprised of the underlying N− substrate material 26. The PN− diode $D_1$ has a cathode comprised of N− substrate 26 and an anode comprised of the P well material 28. Diode $D_1$ is connected to the emitter of transistor T through the central P+ region 30 and a metal layer 38. The PN+ diode, $D_2$, is comprised of the outer annular N+ region 36 surrounding the P well 28. The resistor, R, is comprised of the bulk resistance in the lightly doped P well 28 which separates the P+ region 30 from the anode of diode $D_2$. The purpose of resistor R is to provide a shunt path for the leakage current of the PN+ diode, $D_2$, and thus prevent unwanted turn-on of transistor T. Ohmic contact is made to the N+ region 36 by metallic contacts 35.

Figure 4:
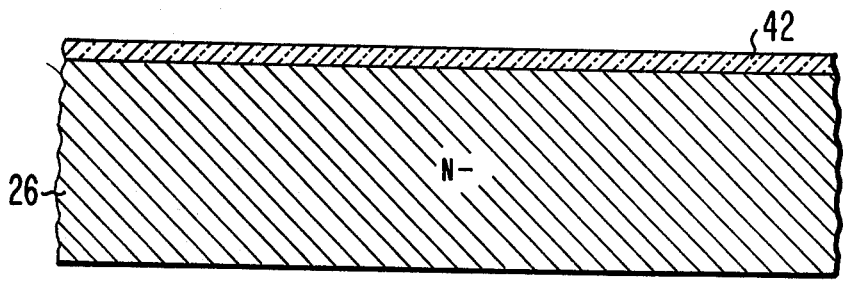
FIGS. 4–7 are cross-sectional views showing an example of the fabrication of the protective circuit of the present invention.

In order to manufacture a COS/MOS integrated circuit which employs the present invention, one starts with a wafer of semiconductor material. Referring to FIG. 4, an appropriate wafer 26 may be lightly doped N type silicon having a surface oriented substantially parallel to the 100 crystallographic plane. An oxide layer 42 is formed on the surface of the wafer 26 by any appropriate process, such as by thermal oxidation of the wafer 26 in a furnace in a manner well known in the MOS art.

Figure 5:
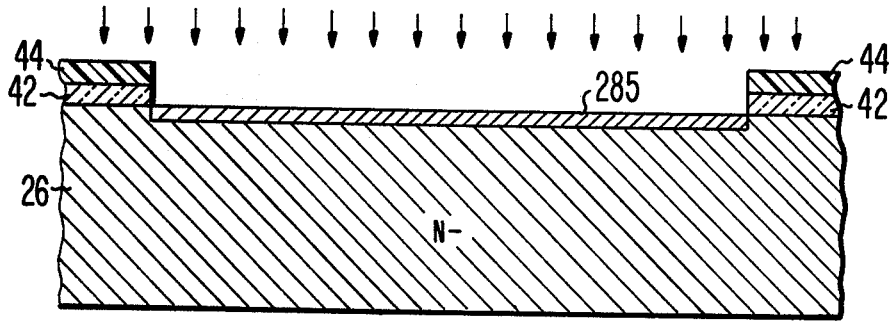

Referring to FIG. 5 a layer of photoresist material 44 is applied to the surface of the oxide layer 42 and the area where the P well region 28 is to be located is defined on the photoresist layer 44. Following development of the photoresist layer 44, portions of the oxide layer 42 which are exposed are removed by any appropriate etching process. Then, the surface of the wafer is, preferably, ion implanted with an acceptor type impurity, such as boron, to form a shallow P type region 28S.

Figure 6:
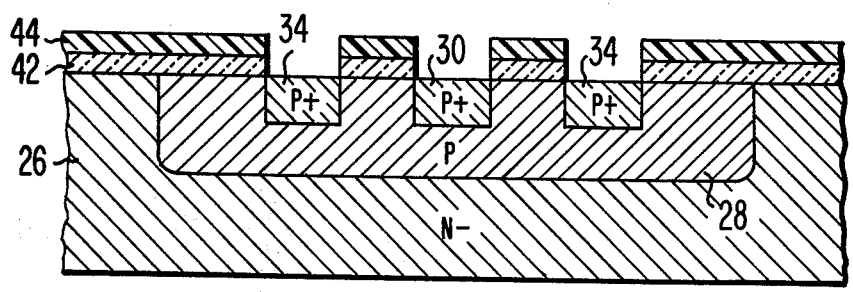

Following the removal of the photoresist layer 44, the wafer 26 is placed into a furnace to drive in the implanted impurity atoms in the region 28S thereby to form P well 28. The oxide layer 42 is reformed on the surface of the wafer 26 while the wafer is in the furnace. Next, a second photomask is used to define the areas where P+ regions 30 and 34 will be located, and acceptor impurities are implanted or diffused into those areas with the result shown in FIG. 6.

Figure 7:
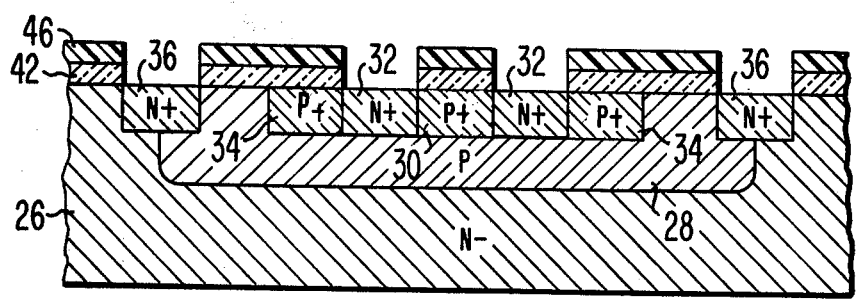

With reference to FIG. 7, the oxide layer 42 is again reformed over the surface of the wafer 26. A photoresist layer 46 is applied over the surface of the oxide 42, and a third photomask is used to define the areas where the donor impurities are to be diffused into the wafer to form the N+ regions 32, 36 after which the diffusion is carried out. The photoresist and oxide layers 46, 42 are then removed and oxide layer 42 is reformed over the entire surface of the wafer 26.

Next, a photoresist layer and a fourth photomask are used to define contact openings in the oxide layer 42. A metal layer is deposited over the entire surface of the oxide and a photoresist layer and a fifth photomask are used to define the metal layer into connecting lines to form the appropriate connections.

While the present invention has been described with reference to the circuit shown in FIGS. 1-7, it will be obvious to one of ordinary skill in the semiconductor art that the conductivity of the semiconductors can be reversed without departing from the spirit or scope of the invention. Thus, the circuit can be made with a PNP transistor rather than an NPN transistor in which event the anodes and the cathodes of diodes $D_1$ and $D_2$ would be interchanged and the protective circuit would be connected between the circuit node connected to the negative potential in the integrated circuit and to the other terminals of the integrated circuit which are to be protected from transients.

Figure 8:
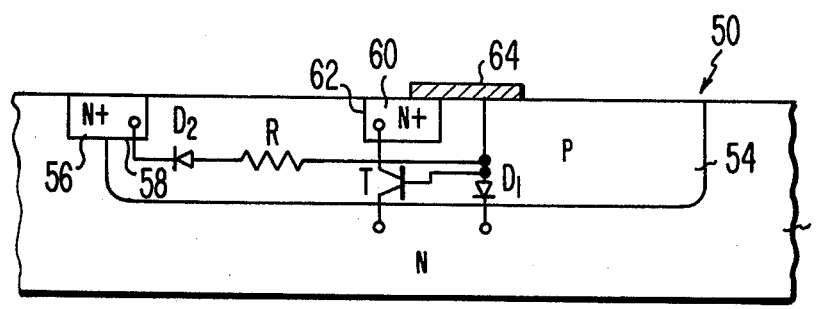
FIG. 8 is a cross-sectional view of an alternative embodiment of the invention.

Other changes may also be made without departing from the invention. For example, an alternative embodiment of the protective circuit is the structure 50 shown in FIG. 8. In the structure 50, there is an N type substrate 52 having P well 54 formed therein. An N+ region 56 forms a PN junction 58 with the P well 54. While not shown in plan view, the region 56 in this embodiment does not surround the P well 54 but lies adjacent one side of the P well 54. A second N+ region 60 extends into the P well 54 and forms a PN junction 62 therewith. A conductive material 64 makes electrical contact to the N+ region and to the P well 54 on the side of the N+ region disposed away from the N+ region 56, so that the portion of the P well 54 contacted by the material 64 is isolated from the N+ region 56 by the N+ region 60. The schematic diagram of the protective circuit is also shown in FIG. 8. The contact 64 is located on the side of the N+ region 60 away from the N+ region 56 in order to provide the resistance, R, which predominantly results from the region of the P well 54 beneath the N+ region 60. While the structure shown in FIG. 8 would not operate nearly so well as the preferred embodiment of the invention described with reference to FIGS. 1-7, the alternative embodiment of FIG. 8 is described in order to show an example of a change which may be made without departing from the spirit or scope of the invention.

I claim:
1. A device comprising:
   (a) a semiconductor substrate of a first conductivity type;
   (b) a well region of opposite conductivity type to said substrate extending into said substrate from a surface thereof;
   (c) a first region extending into said well region from a surface thereof, said first region being of the same conductivity type as said substrate;
   (d) a second region of the same conductivity type as said first region, said second region extending into both said well region and said substrate, said second region being more highly doped than said substrate;
   (e) first means for making electrical contact to said second region, said first means thereby making electrical contact to said second region and to said substrate; and
   (f) second means for simultaneously contacting said first region and said well region, the portion of said well region contacted by said second means being isolated from said second region by said first region, said second means including a third region of the same conductivity type as said well region but having a higher doping concentration, said third region being surrounded by said first region.
2. The device of claim 1 further comprising a fourth region of the same conductivity type as said well but having a higher doping concentration than said well, said fourth region surrounding said first region.
3. The device of claim 2 wherein said second region surrounds said fourth region.
4. The device of claim 1 wherein said substrate is comprised of lightly doped N type material.
5. The device of claim 1 wherein said substrate is comprised of lightly doped P type material.

* * * * *